(12) United States Patent
Farrell et al.

(10) Patent No.: US 11,334,692 B2
(45) Date of Patent: May 17, 2022

(54) EXTRACTING A KNOWLEDGE GRAPH FROM PROGRAM SOURCE CODE

(71) Applicant: International Business Machines Corporation, Armonk, NY (US)

(72) Inventors: Robert G. Farrell, Cornwall, NY (US); Mohammad S. Hamedani, West Lafayette, IN (US)

(73) Assignee: International Business Machines Corporation, Armonk, NY (US)

( * ) Notice: Subject to any disclaimer, the term of this patent is extended or adjusted under 35 U.S.C. 154(b) by 942 days.

(21) Appl. No.: 15/637,925

(22) Filed: Jun. 29, 2017

(65) Prior Publication Data

US 2019/0005163 A1   Jan. 3, 2019

(51) Int. Cl.

| | |
|---|---|
| *G06F 30/18* | (2020.01) |
| *G06N 5/02* | (2006.01) |
| *G06F 16/35* | (2019.01) |
| *G06F 16/901* | (2019.01) |
| *G06F 40/30* | (2020.01) |
| *G06F 40/56* | (2020.01) |
| *G06F 40/295* | (2020.01) |
| *G06N 7/00* | (2006.01) |
| *G06N 3/04* | (2006.01) |
| *G06F 40/154* | (2020.01) |

(52) U.S. Cl.
CPC .......... *G06F 30/18* (2020.01); *G06F 16/355* (2019.01); *G06F 16/9024* (2019.01); *G06F 40/295* (2020.01); *G06F 40/30* (2020.01); *G06F 40/56* (2020.01); *G06N 5/02* (2013.01); *G06N 5/022* (2013.01); *G06F 40/154* (2020.01); *G06N 3/0445* (2013.01); *G06N 3/0454* (2013.01); *G06N 7/005* (2013.01)

(58) Field of Classification Search
CPC .......... G06N 5/02; G06N 5/022; G06N 5/003; G06N 3/0445; G06N 3/0454; G06N 7/005; G06F 16/3329; G06F 16/3344; G06F 16/355; G06F 16/9024; G06F 40/154; G06F 40/205; G06F 40/295; G06F 40/30; G06F 40/56; G06F 30/18
See application file for complete search history.

(56) References Cited

U.S. PATENT DOCUMENTS

| 8,407,253 B2 | 3/2013 | Ryu et al. |
| 2016/0055409 A1 | 2/2016 | Majumdar et al. |

FOREIGN PATENT DOCUMENTS

WO   2016042357   3/2016

OTHER PUBLICATIONS

Lin et al., Intelligent Development Environment and Software Knowledge Graph, Journal of Computer Science and Technology, 32(2), pp. 242-249, Mar. 2017. (Year: 2017).*

(Continued)

*Primary Examiner* — Brian M Smith
*Assistant Examiner* — Marshall L Werner
(74) *Attorney, Agent, or Firm* — Stosch Sabo; Ryan, Mason & Lewis, LLP

(57) ABSTRACT

Entities and relations associated with source code of a program are extracted. An entity completion on the extracted entities and relationships is performed to produce a knowledge graph of the source code. Repeated patterns of relationships are identified from the knowledge graph across the source code.

20 Claims, 10 Drawing Sheets

800
KNOWLEDGE GRAPH
(SOURCE CODE AND NATURAL LANGUAGE KNOWLEDGE GRAPHS AFTER RESOLUTION)

(56) References Cited

OTHER PUBLICATIONS

Lin et al., Learning Entity and Relation Embeddings for Knowledge Graph Completion, Twenty-Ninth AAAI Conference on Artificial Intelligence, pp. 2181-2187, Jan. 2015. (Year: 2015).*

Han et al., Joint Representation Learning of Text and Knowledge for Knowledge Graph Completion, Nov. 2016. (Year: 2016).*

Wikipedia, "Dynamic Program Analysis," www.en.wikipedia.org/wiki/Dynamic-program-analysis, Apr. 26, 2017, 2 pages. (Year: 2017).*

Modi et al., Towards Automated Threat Intelligence Fusion, 2016 IEEE 2nd Annual Conference on Collaboration and Internet Computing, pp. 408-416, Nov. 2016. (Year: 2016).*

Moses et al., Static Analysis: A Dynamic Syntax Tree Implementation, Dec. 2001. (Year: 2001).*

Marcus et al., Identification of High-Level Concept Clones in Source Code, pp. 107-114, 2001. (Year: 2001).*

Míšek et al., Mapping of Dynamic Language Constructs into Static Abstract Syntax Trees, 9th IEEE/ACIS International Conference on Computer and Information Science, pp. 625-630, 2010. (Year: 2010).*

Benjamin et al., Towards Ontology-Driven Interoperability for Simulation-Based Applications, Proceedings of the 2009 Winter Simulation Conference, pp. 1375-1386, Dec. 2009. (Year: 2009).*

Bontcheva et al., Learning Ontologies from Software Artifacts: Exploring and Combining Multiple Sources, Jan. 2006. (Year: 2006).*

T. Mitchell et al., "Never-Ending Learning," Proceedings of the Twenty-Ninth AAAI Conference on Artificial Intelligence, Feb. 19, 2015, pp. 2302-2310.

H. Poon et al., "Unsupervised Ontology Induction from Text," Proceedings of the 48th Annual Meeting of the Association for Computational Linguistics (ACL), Jul. 11-16, 2010, pp. 296-305.

M. Sadoghi et al., "Self-Curating Databases," Proceedings of the 19th International Conference on Extending Database Technology (EDBT), Mar. 15-18, 2016, pp. 467-472.

Wikipedia, "Static Program Analysis," www.en.wikipedia.org/wiki/Static_program_analysis, Apr. 27, 2017, 3 pages.

Wikipedia, "Dynamic Program Analysis," www.en.wikipedia.org/wiki/Dynamic_program_analysis, Apr. 26, 2017, 2 pages.

H.M. Sneed et al., "Extracting Business Rules from Source Code," Proceedings of the 4th Workshop on Conference: Program Comprehension, Apr. 1996, pp. 240-247.

A. Marcus et al., "An Information Retrieval Approach to Concept Location in Source Code," Proceedings of the 11th Working Conference on Reverse Engineering (WCRE), Nov. 8-12, 2004, pp. 214-223.

A. Marcus et al., "Identification of High-Level Concept Clones in Source Code," Proceedings of the 16th IEEE International Conference on Automated Software Engineering (ASE), Nov. 26-29, 2001, Nov. 26-29, 2001, 8 pages.

Valery D. Solovyev et al., "Generating Abbreviations Using Google Books Library," https://arxiv.org/ftp/arxiv/papers/1410/1410.1080.pdf, Oct. 4, 2014, 5 pages.

github.com, "SimpleNLG," https://github.com/simplenlg, Jun. 25, 2020, 1 page.

github.com, "SimpleNLG / SimpleNLG," https://github.com/simplenlg/simplenlg, 2020, 3 pages.

Wikipedia, "Natural-Language Generation," https://en.wikipedia.org/wiki/Natural-language_generation, Jul. 26, 2020, 7 pages.

ACL Wiki, "Downloadable NLG Systems," https://aclweb.org/aclwiki/index.php?title=Downloadable_NLG_systems, Jun. 29, 2020, 8 pages.

David Ferrucci et al., "Building Watson: An Overview of the DeepQA Project," AI Magazine, Fall, 2010, 32 pages.

Nguyen Bach et al., "A Review of Relation Extraction," https://www.cs.cmu.edu/~nbach/papers/A-survey-on-Relation-Extraction.pdf, 2007, 15 pages.

Wen-Tau Yih et al., "Semantic Parsing via Staged Query Graph Generation: Question Answering with Knowledge Base," https://www.microsoft.com/en-us/research/publication/semantic-parsing-via-staged-query-graph-generation-question-answering-with-knowledge-base/, Jul. 2015, 12 pages.

Qi Li et al., "Incremental Joint Extraction of Entity Mentions and Relations," Proceedings of the 52nd Annual Meeting of the Association for Computational Linguistics, https://nlp.cs.rpi.edu/paper/jointmentionrelation.pdf, Jun. 23-25, 2014, pp. 402-412.

R. Florian et al., "A Statistical Model for Multilingual Entity Detection and Tracking," Proceedings of the Human Language Technology Conference of the North American Chapter of the Association for Computational Linguistics HLT-NAACL 2004, May 2-7, 2004, 8 pages.

* cited by examiner

SOURCE CODE FILE ⟵ 300

```
package chat;

Import java.io.*;

/** A single message in a chat. */
  public class ChatMessage implements Serializable { private String message;

ChatMessage(String message) {
          this.message = message;
      }

/** Sends a message. The message is a string. */
      void send() {
          System.out.println(message);
      } public static void main(String[] args) {
          ChatMessage m = new
              ChatMessage(args[0]);
          m.send();
      }
  }
}
```

COMMENT 310

PROGRAM STATEMENT 320

400
ABSTRACT SYNTAX TREE (AST)

500

600

700
NATURAL LANGUAGE KNOWLEDGE GRAPH

800
KNOWLEDGE GRAPH
(SOURCE CODE AND NATURAL LANGUAGE KNOWLEDGE GRAPHS AFTER RESOLUTION)

EXTRACTING A KNOWLEDGE GRAPH FROM PROGRAM SOURCE CODE

BACKGROUND

The present invention relates to computing systems, and more specifically, to processing program source code in such computing systems.

One class of unstructured information is source code for software programs, or programs, which may be written in high-level programming languages. For a variety of reasons, source code may not be well understood. For example, a program may exist in an organization much longer than the individual who created it, or the program may be so large and complex that no one individual can understand it.

SUMMARY

Illustrative embodiments provide for extracting a knowledge graph from program source code.

For example, in one illustrative embodiment, a method for constructing or augmenting a knowledge graph from source code of a program is provided. The method includes extracting concepts and relationships associated with source code of a program. An entity and relation completion is performed on the extracted entities and relationships to produce a knowledge graph of the source code. Repeated patterns of relationships are identified from the knowledge graph across the source code. The steps of the method are implemented by at least one processing device comprising a processor operatively coupled to a memory.

For example, in another illustrative embodiment, an article of manufacture for constructing or augmenting a knowledge graph from source code of a program is provided. The article comprises a processor-readable storage medium for storing processor-readable program code which, when executed, causes a processor to perform the steps of: extracting concepts and relationships associated with source code of a program; performing an entity and relation completion on the extracted concepts and relationships to produce a knowledge graph of the source code; and identifying repeated patterns of relationships from the knowledge graph across the source code.

For example, in yet another illustrative embodiment, a system for constructing or augmenting a knowledge graph from source code of a program is provided. The system includes at least one processor operatively coupled to a memory and configured to: extract concepts and relationships associated with source code of a program; perform an entity and relation completion on the extracted concepts and relationships to produce a knowledge graph of the source code; and identify repeated patterns of relationships from the knowledge graph across the source code.

These and other exemplary embodiments of the invention will be described or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 3 depicts an illustration of a source code file according to an embodiment of the present invention.

DETAILED DESCRIPTION

Exemplary embodiments of the invention will now be discussed in further detail with regard to systems and methods for constructing or augmenting a knowledge graph from a program source code base written in a high-level programming language. This invention may, however, be embodied in many different forms and should not be construed as limited to the embodiments set forth herein.

Knowledge of how to perform tasks is often buried in organizations and often from unstructured information sources. One important class of unstructured information is source code for software programs. For a variety of reasons, such source code may not be well understood. For example, the software program may exist in organizations much longer than the people who created it and the software program may be so large and complex that no one person can understand it.

While documentation, code, and other software artifacts in a software system may indicate some aspects of what the software system does, it may take too much time to read through and understand all the artifacts. This knowledge is a prerequisite to performing tasks such as question answering. Therefore, it is realized herein that techniques are needed for building a knowledge graph from software artifacts.

Furthermore, one can view software as a handcrafted set of complex procedures and rules (with more precise semantics than natural languages). Given that there is an abundance of software artifacts available today, either in traditional form of monolithic architecture or the emerging micro-services architecture, there is an opportunity to extract the embedded knowledge in the software to either construct a new knowledge graph or augment an existing one.

A method and system according to illustrative embodiments will now be discussed in further detail.

Figure 1:
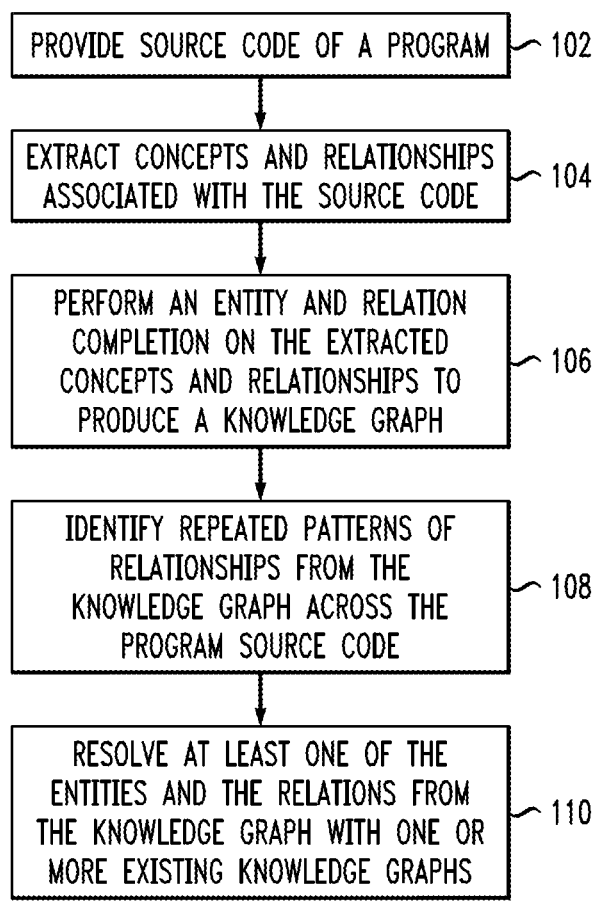
FIG. 1 depicts a flow diagram of a process for constructing or augmenting a knowledge graph according to an embodiment of the present invention.

FIG. 1 is a flow diagram illustrating one embodiment of a method 100 for constructing or augmenting a knowledge graph by extracting embedded knowledge in software procedures and data. At step 102, source code of a program 102 is provided. The source code may include, for example, manifests/file names, code headers/metadata, comments, procedure, and variable names. In one embodiment, the source code is written in a high-level programming language. Examples of high-level programming languages include Java, Python, Perl, C, C++, BASIC, etc. The source code may be commented. It is to be appreciated that, in alternative embodiments, the programming language can be a scripting language, such as, for example, JavaScript, wherein the original or source code does not necessarily need to be compiled but rather interpreted.

Figure 2:
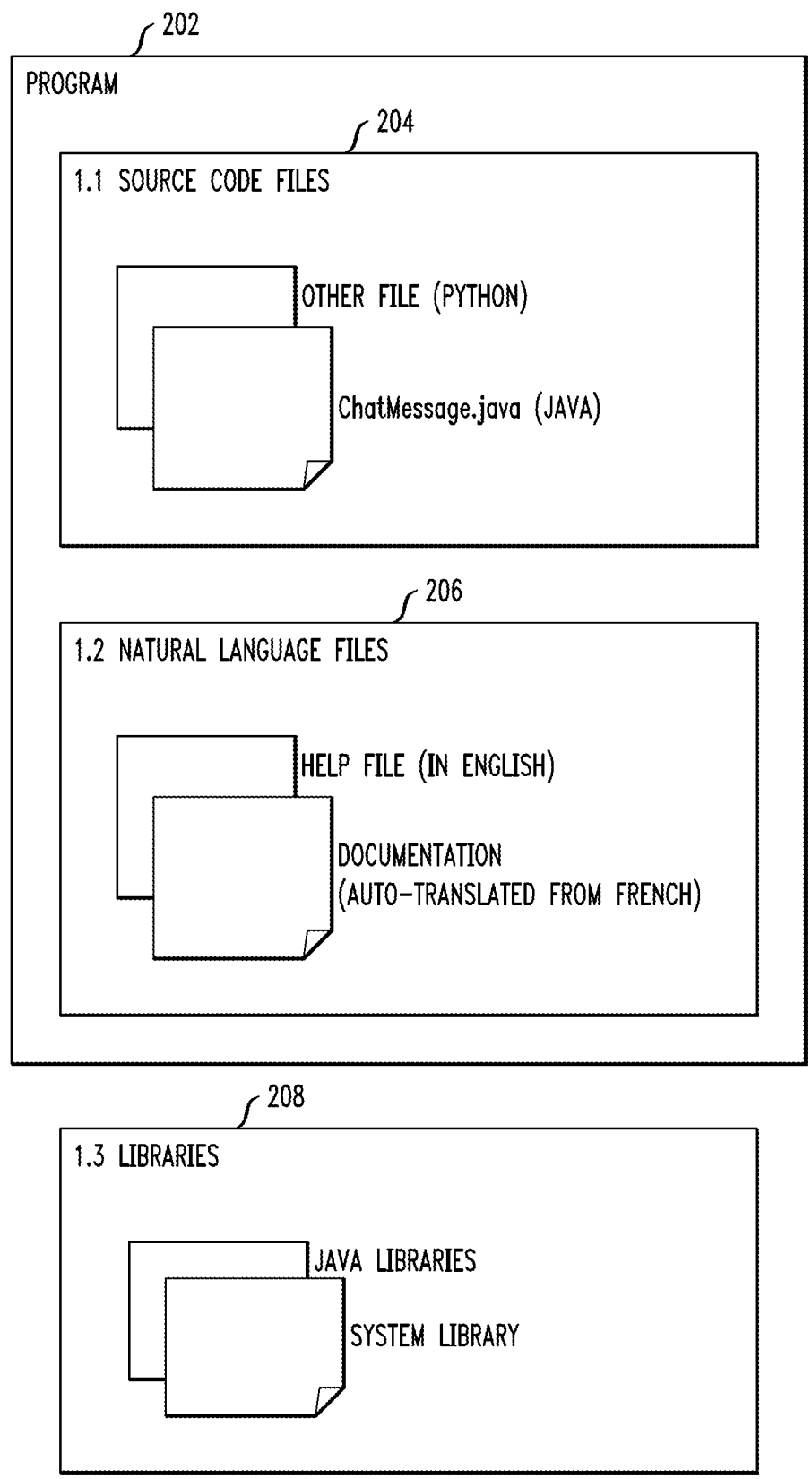
FIG. 2 depicts a functional block diagram of a program according to an embodiment of the present invention.

With reference to FIG. 2, a block diagram is provided illustrating an exemplary program 202. Program 202 may comprise files written in one or more natural languages and one or more computer languages. For example, as shown in FIG. 2, the program 202 may comprise a set of source code files 204 and a set of natural language files 206. FIG. 2 is further shown comprising libraries 208, which may be stored on a storage device. Source code for the libraries 208 may or may not be included in the set of source code files 204.

A source code base may comprise a list of program files in one or more high-level languages as set forth below:

| File | Language |
|---|---|
| File1 | Java |
| File2 | Java |
| File3 | Java |
| File4 | Python |

Generally, each file is written or coded in one programming language. However, a given file could be written or coded in multiple languages. One example of a source code file, ChatMessage.java depicted in the set of source code files 204 of FIG. 2, is source code file 300 shown in FIG. 3. As shown, the source code file 300 comprises comments 310 and program statements 320. ChatMessage.java is written in the Java programming language and thus has certain keywords (e.g., package, import, public, class, private, void, static, new), some comments (e.g., between /** and */ written in English), some literals (e.g., 0), names of variables (e.g., message, m, and args), user-defined functions (e.g., send), classes (e.g., ChatMessage), and system types (String is used but Integer and others are possible), functions (e.g., the assignment operator "=" is used and println in System.io package, but it could be +, -, or many other functions). It is to be understood and appreciated that the embodiments are not limited to the Java programming language, and that other programming languages may be implemented. For example, programs written in other programming languages would have a different set of programming language constructs, but of a similar nature, such as reserved keywords, functions, strings, etc. The source code file 300 can be compiled and run such that the user passes some text and the program prints it. For example, if the program is run on the command line of a computer it has the following behavior:

Input: ChatMessage "Come here, Watson."
Output: Come here, Watson.

This is a simple example of a program and one skilled in the art would recognize that programs can have this general character while having greater complexity.

Referring back to FIG. 1, at step 104, concepts and relationships associated with the source code are extracted.

In one embodiment, step 104 comprises generating a natural language text from one or more elements of the source code, and parsing the natural language text to extract the concepts and relationships. One or more of the following components may be used to assist in generating the natural language: a programming language parser, a programming language pre-processor, and a natural language generator. A programming language pre-processor may be used to generate an expanded version of the program. Some languages have a pre-processor built in (e.g., C++) and others do not, but the operations are known in the art (packaging, including, import/export, macros, etc.).

In one embodiment, a programming language parser for target languages (Java, C++, etc.) can be used to generate an abstract syntax tree (AST), as discussed below with reference to FIG. 4. In addition, required data can also be used. The required data may comprise one or more of a standard dictionary for the natural language of the writer of the source code, a natural language translator to obtain all comments in the same natural language if needed, and a system dictionary with canonical phrases for system identifiers. To generate the natural language text, an AST is first generated from the source code program, e.g., ChatMessage.java. AST generation from source code is known in the art, and further details regarding AST generation will not be discussed herein. A compiler (e.g., gcc for the C programming language) may run the preprocessing directives first, expand the code and then generate the AST. In addition to the hierarchical parsing of the input file provided by the compiler in generating the AST, the method herein further differentiates five types of nodes.

Figure 4:
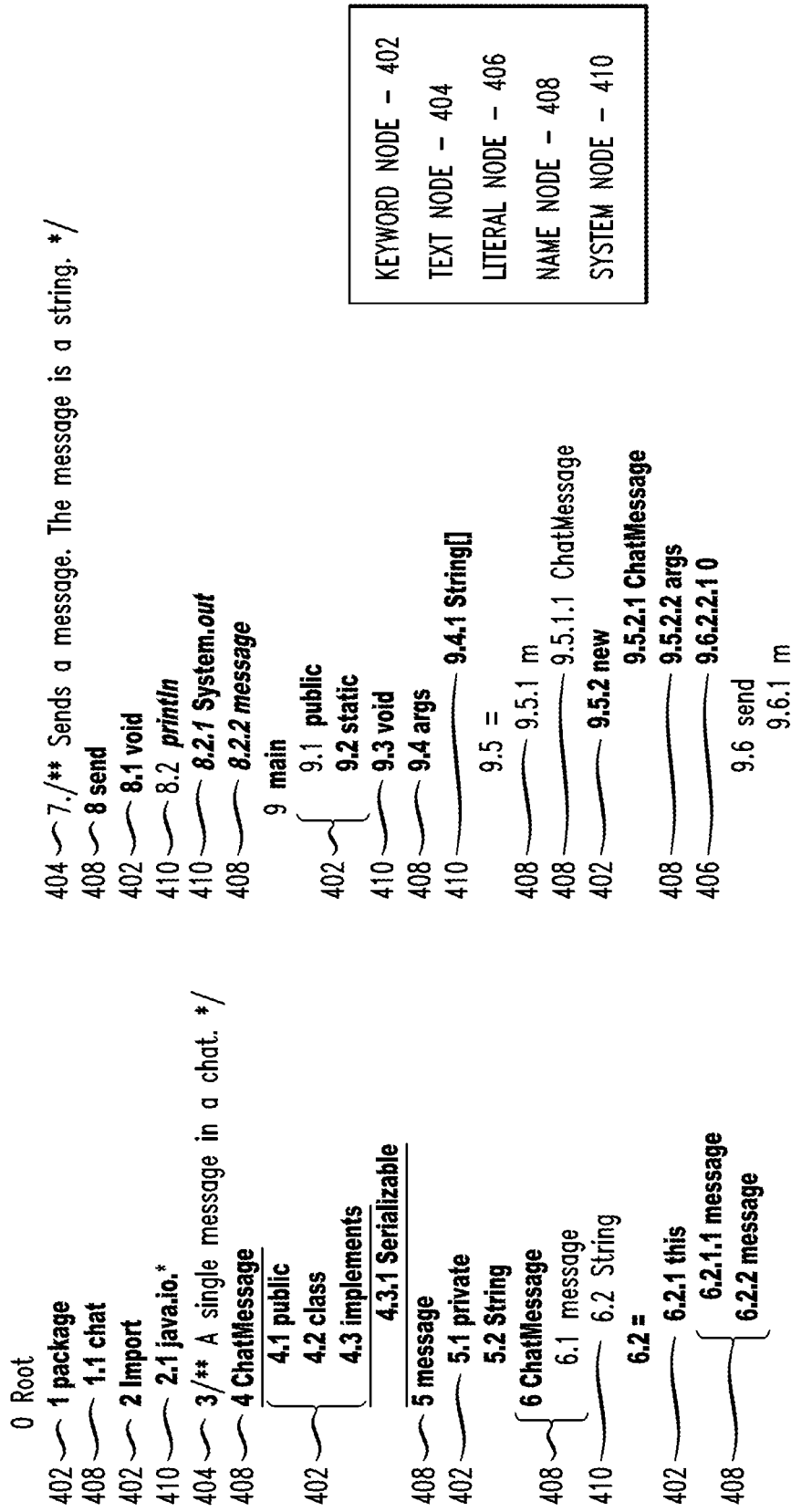
FIG. 4 depicts an illustration of an abstract syntax tree (AST) according to an embodiment of the present invention.

As shown in FIG. 4, the five types of nodes of AST 400 are keyword node 402, text node 404, literal node 406, name node 408 and system node 410. Keyword nodes refer to unique keywords in the programming language that identify statements/commands, e.g., public, private, static, new, this, and void. Text nodes refer to comments containing natural language that are parsed and undergo concept and relationship extraction. Literal nodes refer to numbers and other literals that are not mapped to natural language but are included in the output. Name nodes refer to user-supplied identifiers such as variable names and function names that can be mapped to natural language.

System nodes 410 are similar to keyword nodes 402 except they are not pre-enumerated, and also pre-enumerated system identifiers for operators ("+") and pre-defined functions ("substr"→substring"). A mapping may be defined for each programming language from strings in the system AST nodes to entries in a dictionary. For example:

"*", "times",
"+", "plus"
"/", "divided by"
"-", "minus"
">", "greater than"
"<", "less than"
">=", "greater than or equal to"
"<=", "less than or equal to"
"==", "is"
"&&", "and"
"||", "or"
"~", "is not"

For instance, if a node is of the type "operator" and contains the text ">" then it would be mapped to the string "greater than". Text may be outputted as pseudo natural language (pseudo-NL) and can include text before and possibly after this node text. For example, "while . . . do" may become "while . . . " in pseudo-NL. Embedded code can become quite complex. For this, the system uses parenthesis. For example, "Repeat . . . (Repeat . . . Done repeat) . . . Done repeat." Different types of parenthesis can be used to embed multiple levels such as "(", "{", and "[".

Referring back to FIG. 1, the natural language generator can then be used to generate a natural language text. In this regard, the natural language generator may be able to have variables that are then filled in from context. For example, "program" (e.g., referring to the chat program itself) might be the subject of the sentence. In natural language, something may be introduced and then referenced with a pronoun (e.g., "it"). For verbs, the default is present simple tense, e.g., "It sends chat messages".

An illustrative example of a natural language generator is SimpleNLG. SimpleNLG handles orthography (e.g., whitespace, punctuation, line break and lists), morphology (e.g., inflected forms) and grammar (e.g., noun-verb agreement and auxiliary verbs). As one skilled in the art will readily appreciate, other various natural language generation methods can be used herein. For example, natural language generation methods such as Hidden Markov Models, neural networks, supervised learning, stochastic methods, probabilistic methods, deep learning (e.g., LTSM, RNN, CVN) and others may be implemented. In all cases, text strings with some annotations (e.g., part of speech) and structure (e.g., logical, sequence, etc.) can be used to generate a surface form of natural language text.

In one embodiment, the extracted entities and relations are integrated with entities and relations extracted from one or more additional sources associated with the program code (e.g., help files, README files, documentation, etc.).

Parsing the natural language text to extract the entities and relations creates a natural language parse tree using natural language grammar. There are many parsing methods well known in the art. For example, dependency parsing is a particular method that analyzes the grammatical structure of a sentence establishing dependencies between head words (e.g., the word "message" is the head word for the phrase "chat message") and words which modify those head words (e.g., "chat"). This divides the text into tokens. Concepts and relationships can be extracted from the dependency parse tree using rules. Concept and relationship extraction may alternatively be performed using a neural network, maximum entropy model, or another sequential classification method that uses these dependencies and/or human annotations of example data to extract concepts and relationships from the natural language text.

In an alternative embodiment, extracting the concepts and relationships at step 104 comprises capturing a dynamic state of the program during runtime, mapping the dynamic state of the program during runtime to an abstract representation of the source code, and extracting the concepts and relationships from the abstract representation of the code. Capturing the dynamic state of the program during runtime may include capturing program variables and tracking how the program variables are instantiated and/or maintained.

Figure 5:
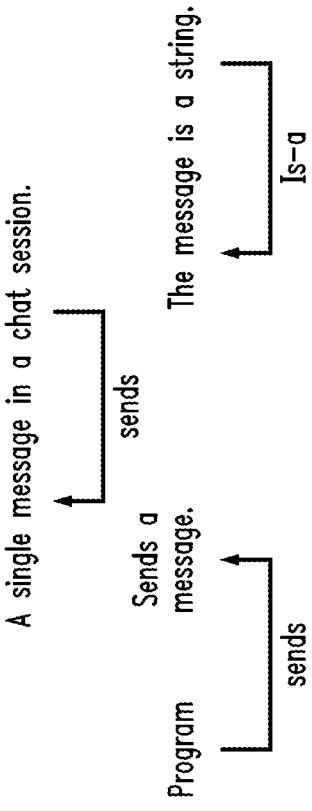
FIG. 5 depicts an illustration of an entity and relation completion on the extracted concepts and relationships according to an embodiment of the present invention.

Exemplary entities and relationships 500 are depicted with reference to FIG. 5. As shown, mentions of certain entity types, or concepts (5.2), such as String, Communication, and Message may be extracted. Human annotation on existing programs may be required to train the system to extract these types of entities and relations. Machine learning methods for extracting entities and relations use a variety of features of the tokens in the text, some of which may be different for natural language generated from program text. For example, capitalized variables may be common in certain software programs, but not typical of typical natural language text. The natural language generation may result in a different distribution of parts-of-speech, such as more verbs and noun phrases instead of determiners, adjectives, adverbs, and so on. In some cases, parts of the software program may need to be removed prior to training the natural language entity and relationship extraction. However, in general, the regular nature of the generated natural language text will make it possible for the system to learn entities and relationships with fewer examples. The specific nature of the natural language and source code will impact the result and iteration may be required to achieve a suitable level of precision. Ultimately, a graph (5.1) is created whereby some strings from the sentences are mentions of entities and those strings that appear more than once in the source code file may be co-referenced, resulting in a single entity. These entities have been classified as entity types, or concepts. Relation words and relations (5.3) may be identified by either certain relation words ("is a") but could also be determined by the entities they are linking, such as a message being sent to a communication. Dependencies from the dependency parse can be used along with the types of entities to do the linking.

Referring back to FIG. 1, at step 106, an entity and relation completion is performed on the extracted concepts and relationships to produce a knowledge graph. In one embodiment, performing the entity and relation completion comprises using a structure of program code elements in the static or dynamic analysis of the program source code to produce a knowledge graph of the source code.

A static analysis, as referred to herein, is an analysis which is performed on source code of a program without executing the program. The issue in entity completion is finding other entities that refer to the same underlying entity. In general, this is a difficult problem, since variables could be referred to differently as program variables, say, and natural language nouns describing the variable. For example, it could be a "chat session" or a "chat". In natural language co-reference resolution, the system links two entities if they are sufficiently similar in features and in context of the surrounding tokens.

For example, using an AST, one can also find references to variables that are used in multiple places and resolve them to the same entity. Thus, the reference to the AST node is maintained with the entities extracted from the entity and relationship extraction step. To efficiently find these references, the extracted entities are indexed with the content (e.g., text) of the AST node. Thus, when multiple entities map to the same AST node, the specific nodes can be found in the AST tree and their relationship within the AST can be used to determine if the reference is to the same entity. An exemplary embodiment uses static analysis in conjunction with natural language processing co-reference resolution to determine if two entities are the same and should be merged (e.g., both the same 'message" variable).

A dynamic analysis, as referred to herein, is an analysis which is performed utilizing both the source code and information from executing the program. Using dynamic analysis, entities and relations between them can be determined based on the values of program variables at run-time. The call stack of function calls can be used for entity and relation completion. If the value of a variable was passed to another function, a determination can be made that these functions are related through the variable. The values of variables could also be analyzed to yield relation tuples. For example, the tuple ([Watson/PERSON], [come/TRAVEL], [here/PLACE]) may be produced directly from a user input such as "Come here, Watson". In some cases, such as relational database cases, the data itself may contain entities and relationships that could be incorporated into the knowledge graph. In general, variables can be tracked (e.g., how they are declared, instantiated, evolve, deleted) through the symbol table in the compiler, and how they are used in functions in the call stack and this run-time aspect can be used to generate relationships for the knowledge graph. As with static analysis, a method of an illustrative embodiment herein combines natural language co-reference resolution with dynamic analysis. The reference to the symbol table and call graph is maintained with the entities extracted from the entity and relationship extraction steps. The text of the variables is then used to index the extracted entities and relationships. When multiple entities are found, they are merged by referring to the symbol table and call graph.

In one embodiment, preprocessor commands (directives) are parsed and converted into relationships to be added to the knowledge graph. When a program is compiled, a preprocessor reads the directives to manipulate files such as including one file in another or macros for expanding source code into another source code. For example, File1 may include File2. A first step is to capture all of these directives as relationships for the knowledge graph. The system captures relationships, and the resulting operations are captured in a tuples table:

| ID | Type1 | Relations | ID2 | Type2 |
|---|---|---|---|---|
| File1 | File | include | File2 | File |
| File1 | File | import | Class1 | Class |
| ChatMessage.java | File | import | java.io.* | File |

Tuples Table

These tuples or relationships can be added to the knowledge graph directly. This allows the system to answer questions like "what is included in File1?"

Figure 6:
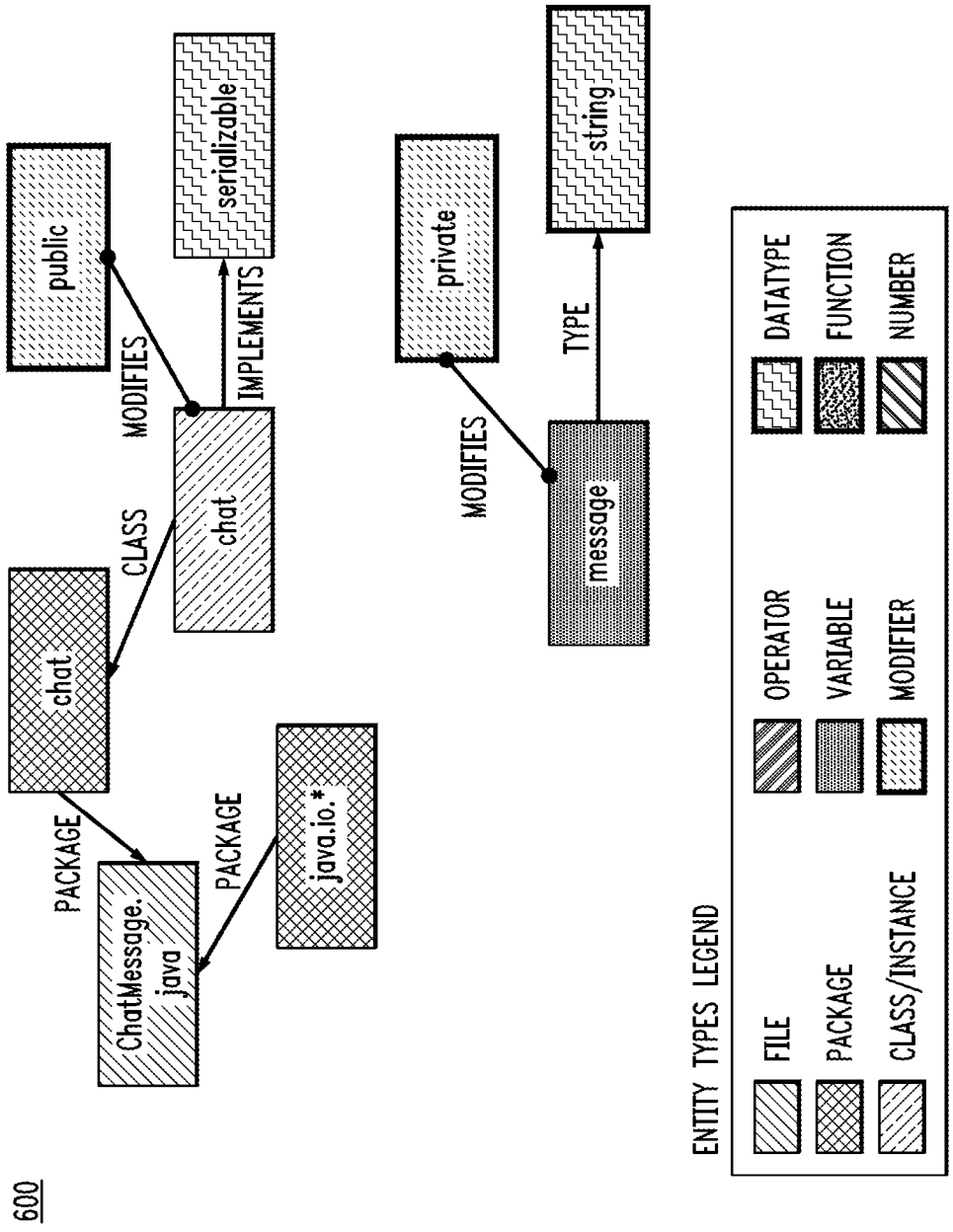
FIG. 6 depicts an illustration of a source code knowledge graph according to an embodiment of the present invention.

An exemplary knowledge graph of source code 600 is depicted in FIG. 6. The source code knowledge graph 600 comprises entities with relations between them. The relations between the entities may be binary (i.e., connecting two relationships). For example, name, system and keyword nodes can be mapped to an entity type, such as File, Package, Class/instance, Operator, Variable, Modifier, Data Type, and Function. Each of the entities in the source code knowledge graph appears only once. For example, if the "Serializable" modifier appears in the graph, then it appears only once and each class that "implements" the "Serializable" modifier has an entity node for the class connected to the "Serializable" node.

Figure 7:
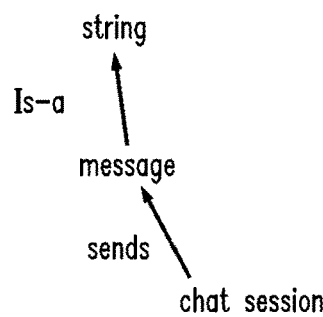
FIG. 7 depicts an illustration of a natural language knowledge graph according to an embodiment of the present invention.

An exemplary natural language knowledge graph 700 is depicted in FIG. 7.

Figure 8:
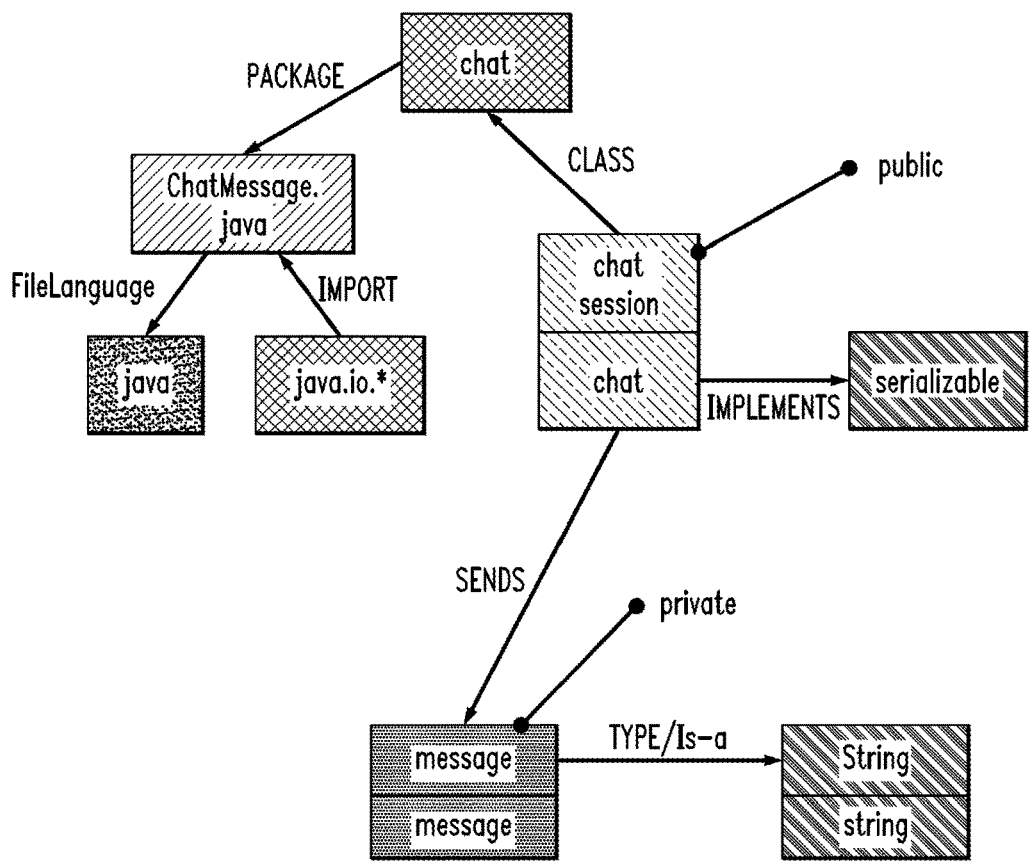
FIG. 8 depicts an illustration of a knowledge graph by connecting the source code knowledge graph with the natural language knowledge graph according to an embodiment of the present invention.

Repeated patterns of relationships are then found from the knowledge graph of the one or more program source elements across the program source code base. For example, as shown in FIG. 8, a knowledge graph 800 may be formed by connecting the natural language knowledge graph of FIG. 6 to the source code knowledge graph of FIG. 7. If the same concepts or relationships are found in the knowledge graphs generated from multiple source code files, then they are merged in the resulting knowledge graph 800. We run the same set of steps so far on a background source code base (e.g., the Eclipse source code in Java) and compute the frequency of each relationship triple. We compare this frequency to the frequency in the program code base. We can use a frequency threshold to thus include only the most statistically significant relationships in the knowledge graph.

The relationships in the knowledge graph 800 are scored so that repeated and significant patterns of relationships are identified. Using the relationship tuple as a "term," term frequency-inverse document frequency (tf-idf) may be applied. The tf-idf is a common metric of significance in information retrieval, and further details regarding tf-idf will not be provided herein. For example, if a significant number of files in the program source code base had "message" is-A String, then it would be given low weight. If the tuple (chat, sends, message) was repeated within the same file, it would be given high weight. The scores can be used for question answering and other tasks to rank answers.

At step 108, repeated patterns of relationships are identified from the knowledge graph across the source code. The identified repeated patterns of relations generalize the relationships and concepts.

In one embodiment, at step 110, at least one of the entities and the relations are resolved between the knowledge graph and one or more existing knowledge graphs.

Accordingly, advantages of the exemplary embodiments herein include at least:

utilizing the source code, not just the documentation;

exploiting existing knowledge graphs, once linked to the source code knowledge graph, to provide semantics for answering questions about the code;

providing semantic relationships between code that is not apparent in the call structure or data flow;

abstracting over any code base, making it possible to form one or more generalizations about a body of code;

exploiting the dynamic state of program (e.g., variables instantiated by ingesting relational data or any other sources of data) during runtime to infer and find patterns of concepts and relationships in the code base within and across multiple source files (or micro-services and modules) in order to augment the knowledge graph; and discovering linkage between a code representation, such as an abstract syntax tree (AST), and the runtime state of the program in order to: (1) link the individual state of the program (e.g., entities and relations) to the knowledge graph; and (2) infer new concepts and relationships among instances and concept by using the structure of the code (e.g., an AST) to augment the knowledge graph.

The embodiments described herein advantageously extract knowledge from a large base of source code, e.g., a source code base, to create a knowledge graph. This extracted knowledge may then be linked to one or more other knowledge graphs to form one or more integrated knowledge graphs. The integrated knowledge graph(s) may then be used for question answering, summarization, search, and a variety of other (cognitive) tasks.

Figure 9:
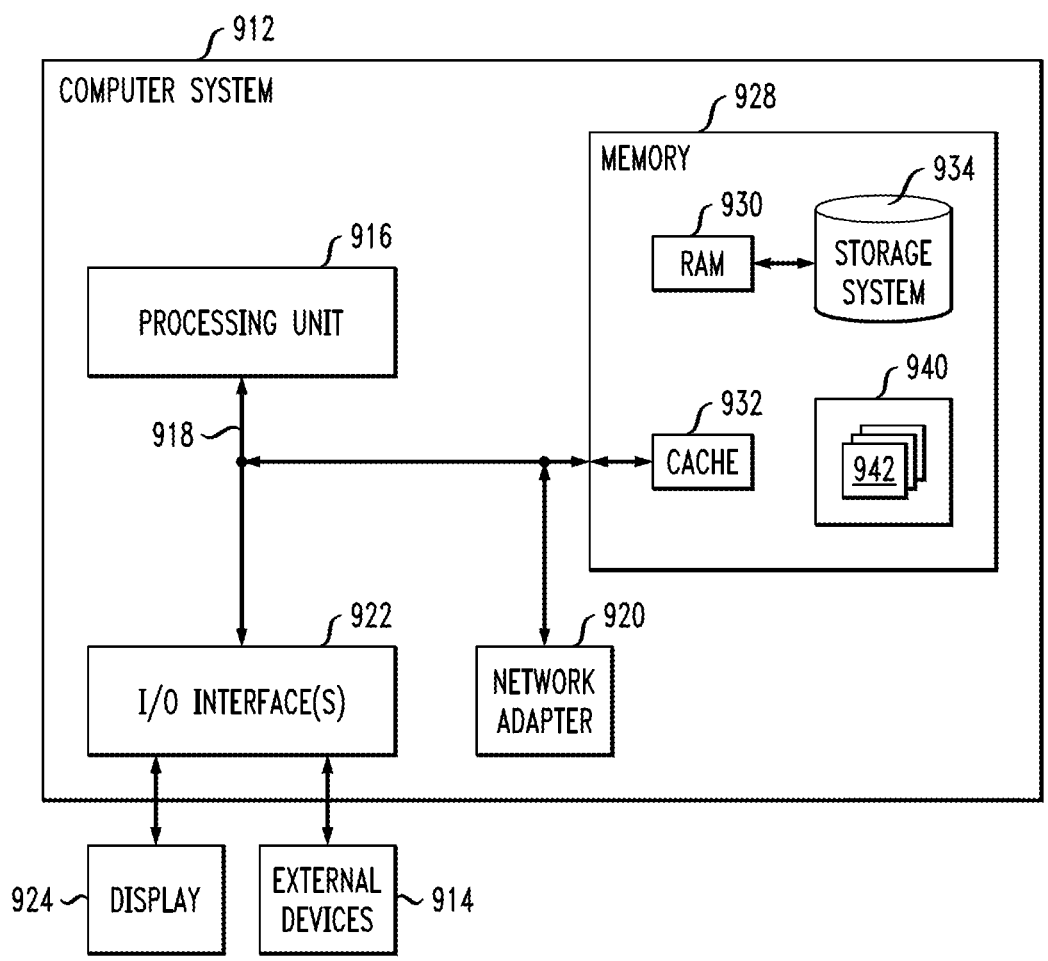
FIG. 9 depicts a computer system in accordance with which one or more components/steps of techniques of the invention may be implemented according to an embodiment of the invention.

One or more embodiments can make use of software running on a computer or workstation. With reference to FIG. 9, in a computing node 910 there is a system/server 912, which is operational with numerous other general purpose or special purpose computing system environments or configurations. Examples of well-known computing systems, environments, and/or configurations that may be suitable for use with system/server 912 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

System/server 912 may be described in the general context of computer system executable instructions, such as program modules, being executed by a computer system. Generally, program modules may include routines, programs, objects, components, logic, data structures, and so on that perform particular tasks or implement particular abstract data types. System/server 912 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, system/server 912 is shown in the form of a computing device. The components of system/server 912 may include, but are not limited to, one or more processors or processing units 916, system memory 928, and bus 918 that couples various system components including system memory 928 to processor 916.

Bus 918 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

System/server 912 typically includes a variety of computer system readable media. Such media may be any available media that is accessible by system/server 912, and it includes both volatile and non-volatile media, removable and non-removable media.

The system memory 928 can include computer system readable media in the form of volatile memory, such as random access memory (RAM) 930 and/or cache memory 932. System/server 912 may further include other removable/non-removable, volatile/nonvolatile computer system storage media. By way of example only, storage system 934 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 918 by one or more data media interfaces.

As depicted and described herein, memory 928 may include at least one program product having a set (e.g., at least one) of program modules that are configured to carry out the functions of embodiments of the invention. A program/utility 940, having a set (at least one) of program modules 942, may be stored in memory 928 by way of example, and not limitation, as well as an operating system, one or more application programs, other program modules, and program data. Each of the operating system, one or more application programs, other program modules, and program data or some combination thereof, may include an implementation of a networking environment. Program modules 942 generally carry out the functions and/or methodologies of embodiments of the invention as described herein.

System/server 912 may also communicate with one or more external devices 914 such as a keyboard, a pointing device, an external data storage device (e.g., a USB drive), display 924, one or more devices that enable a user to interact with system/server 912, and/or any devices (e.g., network card, modem, etc.) that enable system/server 912 to communicate with one or more other computing devices. Such communication can occur via I/O interfaces 922. Still yet, system/server 912 can communicate with one or more networks such as a LAN, a general WAN, and/or a public network (e.g., the Internet) via network adapter 920. As depicted, network adapter 920 communicates with the other components of system/server 912 via bus 918. It should be understood that although not shown, other hardware and/or software components could be used in conjunction with system/server 912. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 10:
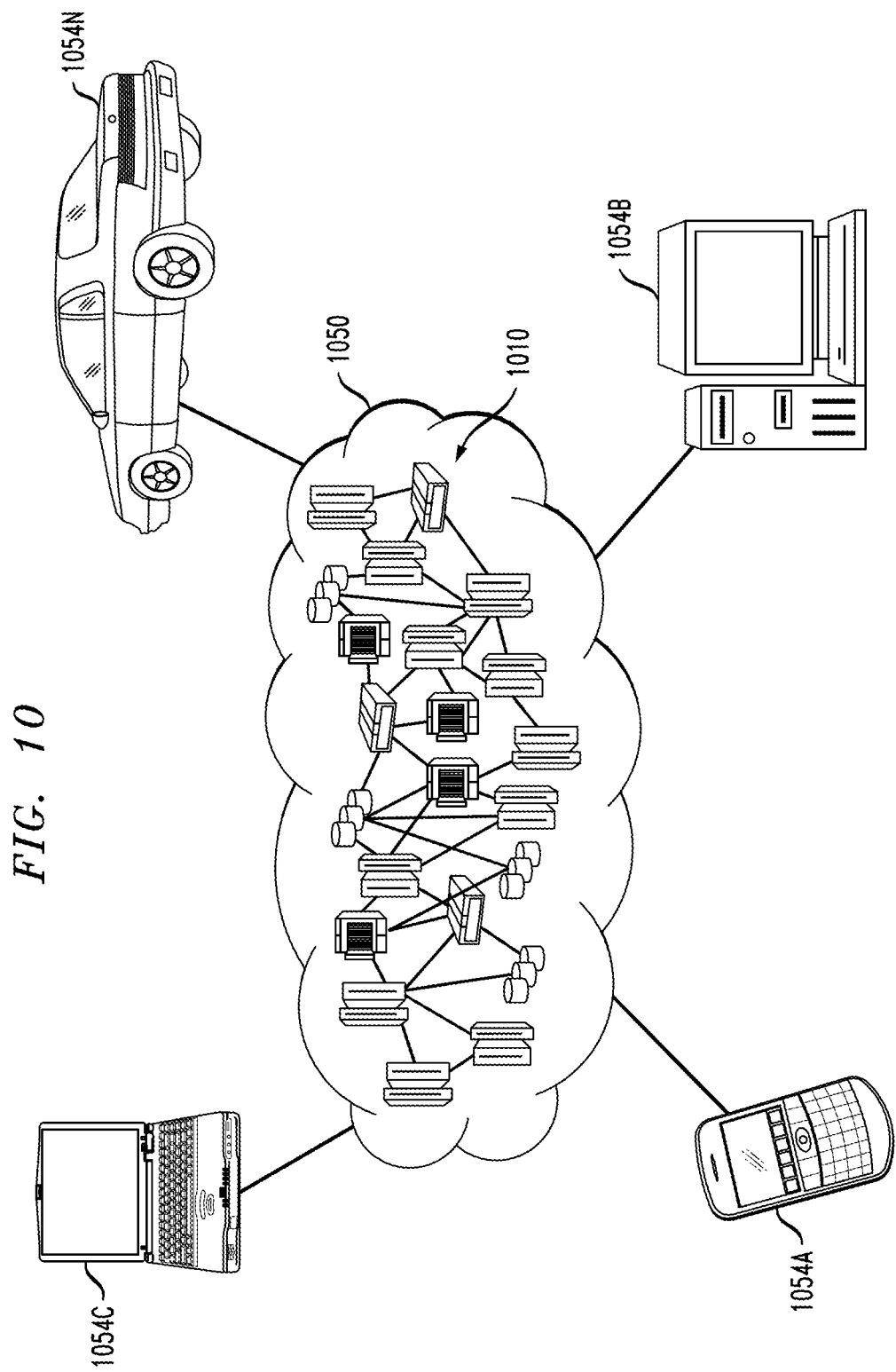
FIG. 10 depicts a cloud computing environment according to an embodiment of the invention.

Referring now to FIG. 10, illustrative cloud computing environment 1050 is depicted. As shown, cloud computing environment 1050 includes one or more cloud computing nodes 1010 with which local computing devices used by cloud consumers, such as, for example, personal digital assistant (PDA) or cellular telephone 1054A, desktop computer 1054B, laptop computer 1054C, and/or automobile computer system 1054N may communicate. Nodes 1010 may communicate with one another. They may be grouped (not shown) physically or virtually, in one or more networks, such as Private, Community, Public, or Hybrid clouds as described hereinabove, or a combination thereof. This allows cloud computing environment 1050 to offer infrastructure, platforms and/or software as services for which a cloud consumer does not need to maintain resources on a local computing device. It is understood that the types of computing devices 1054A-N shown in FIG. 10 are intended to be illustrative only and that computing nodes 1010 and cloud computing environment 1050 can communicate with any type of computerized device over any type of network and/or network addressable connection (e.g., using a web browser).

Figure 11:
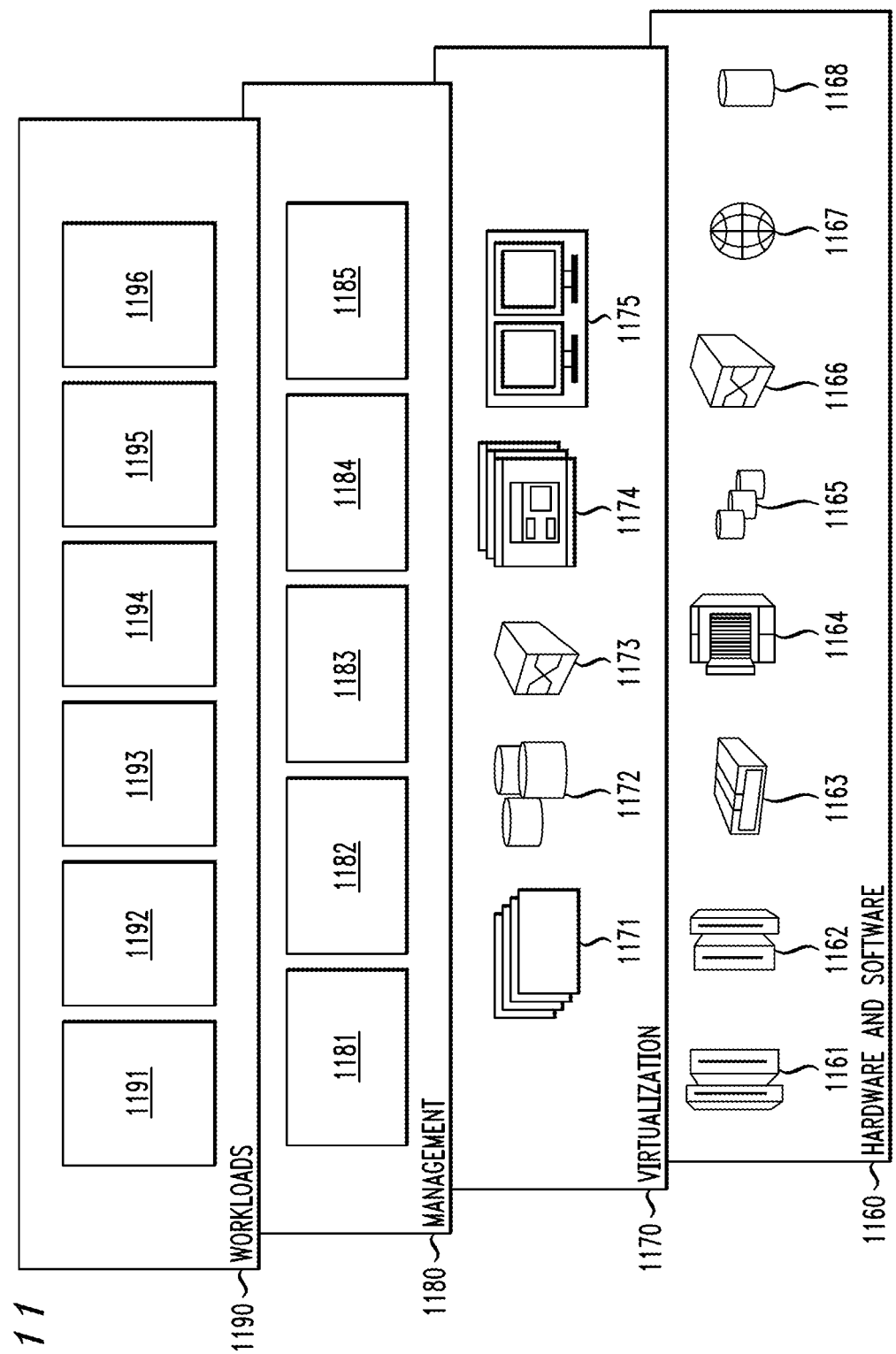
FIG. 11 depicts abstraction model layers according to an embodiment of the present invention.

Referring now to FIG. 11, a set of functional abstraction layers provided by cloud computing environment 1050 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 1160 includes hardware and software components. Examples of hardware components include: mainframes 1161; RISC (Reduced Instruction Set Computer) architecture based servers 1162; servers 1163; blade servers 1164; storage devices 1165; and networks and networking components 1166. In some embodiments, software components include network application server software 1167 and database software 1168.

Virtualization layer 1170 provides an abstraction layer from which the following examples of virtual entities may be provided: virtual servers 1171; virtual storage 1172; virtual networks 1173, including virtual private networks; virtual applications and operating systems 1174; and virtual clients 1175.

In one example, management layer 1180 may provide the functions described below. Resource provisioning 1181 provides dynamic procurement of computing resources and other resources that are utilized to perform tasks within the cloud computing environment. Metering and Pricing 1182 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1183 provides access to the cloud computing environment for consumers and system administrators. Service level management 1184 provides cloud computing resource allocation and management such that required service levels are met. Service Level Agreement (SLA) planning and fulfillment 1185 provide pre-arrangement for, and procurement of, cloud computing resources for which a future requirement is anticipated in accordance with an SLA.

Workloads layer 1190 provides examples of functionality for which the cloud computing environment may be utilized. Examples of workloads and functions which may be provided from this layer include: natural language generation 1191; concept and relation extraction 1192; data analytics processing 1193; knowledge graph production 1194; repeated pattern finding 1195; and ameliorative/corrective/remedial action implementation 1196, which may perform various functions described above.

Embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Embodiments of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
   capturing a dynamic state of a source code of a program during runtime, the program comprising a set of source code files and a set of natural language files, wherein capturing the dynamic state of the program during runtime comprises tracking how variables of the program are instantiated or maintained;
   mapping the dynamic state of the program during runtime to an abstract representation of the source code;

extracting, using machine learning, data correlations associated with the source code of the program, the data correlations being based on patterns in the set of source code files and the set of natural language files;

performing a dynamic analysis of the extracted data correlations utilizing a structure of program code elements of the source code, the dynamic analysis being performed utilizing both the source code and information from an execution of the program to determine data correlations between the source code and the information from an execution of the program based on values of the variables of the program at run-time;

generating a source code knowledge graph based in part on the performing of the dynamic analysis of the extracted data correlations utilizing a structure of program code elements of the source code;

generating a natural language knowledge graph based in part on extracting data correlations associated with the source code of the program;

identifying repeated patterns of relationships from the source code knowledge graph and the natural language knowledge graph;

computing a frequency of each identified repeated relationship from the source code knowledge graph and the natural language knowledge graph;

computing a frequency of each relationship associated with a background source code base;

comparing the frequency of each identified repeated relationship from the source code knowledge graph and the natural language knowledge graph to the frequency of each relationship associated with the background source code base to determine if a frequency threshold is met; and generating a combined knowledge graph based in part on the frequency threshold associated with the identified repeated patterns of relationships, wherein the repeated patterns of relationships are weighted for subsequent processing;

wherein the steps are implemented by at least one processing device comprising a processor operatively coupled to a memory.

2. The method of claim 1, wherein the source code is associated with a high-level programming language.

3. The method of claim 1, wherein extracting the data correlations-associated with the source code comprises generating natural language text from elements of the source code, and parsing the natural language text to extract the data correlations.

4. The method of claim 3, wherein generating the natural language text comprises generating an abstract syntax tree.

5. The method of claim 1, further comprising resolving the extracted data correlations between the combined knowledge graph and one or more existing knowledge graphs.

6. The method of claim 1, further comprising integrating the extracted data correlations with data correlations extracted from one or more additional sources associated with the source code.

7. The method of claim 6, wherein the one or more additional sources comprise one or more of a help file, a README file and documentation.

8. A computer program product comprising a non-transitory computer readable storage medium having computer readable program instructions stored thereon which, when executed by at least one processing device, causes the at least one processing device to perform the steps of:

capturing a dynamic state of a source code of a program during runtime, the program comprising a set of source code files and a set of natural language files, wherein capturing the dynamic state of the program during runtime comprises tracking how variables of the program are instantiated or maintained;

mapping the dynamic state of the program during runtime to an abstract representation of the source code;

extracting, using machine learning, data correlations associated with the source code of the program, the data correlations being based on patterns in the set of source code files and the set of natural language files;

performing a dynamic analysis of the extracted data correlations utilizing a structure of program code elements of the source code, the dynamic analysis being performed utilizing both the source code and information from an execution of the program to determine data correlations between the source code and the information from an execution of the program based on values of the variables of the program at run-time;

generating a source code knowledge graph based in part on the performing of the dynamic analysis of the extracted data correlations utilizing a structure of program code elements of the source code;

generating a natural language knowledge graph based in part on extracting data correlations associated with the source code of the program;

identifying repeated patterns of relationships from the source code knowledge graph and the natural language knowledge graph;

computing a frequency of each identified repeated relationship from the source code knowledge graph and the natural language knowledge graph;

computing a frequency of each relationship associated with a background source code base;

comparing the frequency of each identified repeated relationship from the source code knowledge graph and the natural language knowledge graph to the frequency of each relationship associated with the background source code base to determine if a frequency threshold is met; and generating a combined knowledge graph based in part on the frequency threshold associated with the identified repeated patterns of relationships, wherein the repeated patterns of relationships are weighted for subsequent processing.

9. The computer program product of claim 8, wherein extracting the data correlations associated with the source code comprises generating natural language text from elements of the source code, and parsing the natural language text to extract the data correlations.

10. The computer program product of claim 9, wherein generating the natural language text comprises generating an abstract syntax tree.

11. The computer program product of claim 8, further comprising resolving the extracted data correlations between the combined knowledge graph and one or more existing knowledge graphs.

12. The computer program product of claim 8, further comprising integrating the extracted data correlations with data correlations extracted from one or more additional sources associated with the source code.

13. The computer program product of claim 8, wherein the source code is associated with a high-level programming language.

14. A system comprising:
at least one processor operatively coupled to a memory and configured to:

capture a dynamic state of a source code of a program during runtime, the program comprising a set of source code files and a set of natural language files, wherein capturing the dynamic state of the program during runtime comprises tracking how variables of the program are instantiated or maintained;

map the dynamic state of the program during runtime to an abstract representation of the source code;

extract, using machine learning, data correlations associated with the source code of the program, the data correlations being based on patterns in the set of source code files and the set of natural language files;

perform a dynamic analysis of the extracted data correlations utilizing a structure of program code elements of the source code, the dynamic analysis being performed utilizing both the source code and information from an execution of the program to determine data correlations between the source code and the information from an execution of the program based on values of the variables of the program at run-time;

generate a source code knowledge graph based in part on the performing of the dynamic analysis of the extracted data correlations utilizing a structure of program code elements of the source code;

generate a natural language knowledge graph based in part on extracting data correlations associated with the source code of the program;

identify repeated patterns of relationships from the source code knowledge graph and the natural language knowledge graph;

compute a frequency of each identified repeated relationship from the source code knowledge graph and the natural language knowledge graph;

compute a frequency of each relationship associated with a background source code base;

compare the frequency of each identified repeated relationship from the source code knowledge graph and the natural language knowledge graph to the frequency of each relationship associated with the background source code base to determine if a frequency threshold is met; and generate a combined knowledge graph based in part on the frequency threshold associated with the identified repeated patterns of relationships, wherein the repeated patterns of relationships are weighted for subsequent processing.

15. The system of claim 14, wherein the at least one processor is further configured to:

integrate the extracted data correlations with data correlations extracted from one or more additional sources associated with the source code.

16. The system of claim 14, wherein the source code is associated with a high-level programming language.

17. The system of claim 14, wherein extracting the data correlations associated with the source code comprises generating natural language text from elements of the source code, and parsing the natural language text to extract the data correlations.

18. The system of claim 17, wherein generating the natural language text comprises generating an abstract syntax tree.

19. The system of claim 14, wherein the at least one processor is further configured to:

resolve the extracted data correlations between the combined knowledge graph and one or more existing knowledge graphs.

20. The system of claim 15, wherein the one or more additional sources comprise one or more of a help file, a README file and documentation.

* * * * *